(12) United States Patent
Kai

(10) Patent No.: US 10,637,432 B2
(45) Date of Patent: *Apr. 28, 2020

(54) ELASTIC WAVE DEVICE

(71) Applicant: Murata Manufacturing Co., Ltd., Nagaokakyo-shi, Kyoto-fu (JP)

(72) Inventor: Seiji Kai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

This patent is subject to a terminal disclaimer.

(21) Appl. No.: 15/825,184

(22) Filed: Nov. 29, 2017

(65) Prior Publication Data
US 2018/0091116 A1    Mar. 29, 2018

Related U.S. Application Data

(63) Continuation of application No. PCT/JP2016/067408, filed on Jun. 10, 2016.

(30) Foreign Application Priority Data

Jun. 25, 2015  (JP) .................................. 2015-127148

(51) Int. Cl.
*H03H 9/02* (2006.01)
*H03H 9/25* (2006.01)
(Continued)

(52) U.S. Cl.
CPC ....... *H03H 9/02574* (2013.01); *H01L 41/047* (2013.01); *H01L 41/18* (2013.01);
(Continued)

(58) Field of Classification Search
CPC ............. H03H 9/02086; H03H 9/0222; H03H 9/02574; H03H 9/1064; H03H 9/1071;
(Continued)

(56) References Cited

U.S. PATENT DOCUMENTS 5,998,907 A * 12/1999 Taguchi ............. H03H 9/02574
310/313 R
6,996,882 B2 * 2/2006 Onishi ................ H03H 9/0222
29/25.35

(Continued)

FOREIGN PATENT DOCUMENTS

JP    2002-261582 A    9/2002
JP    2004-274574 A    9/2004
(Continued)

OTHER PUBLICATIONS

Official Communication issued in Japanese Patent Application No. 2017-525207, dated Dec. 18, 2018.
(Continued)

*Primary Examiner* — Barbara Summons
(74) *Attorney, Agent, or Firm* — Keating & Bennett, LLP

(57) ABSTRACT

An elastic wave device includes a support substrate, a film stack including a piezoelectric thin film, and an IDT electrode. The film stack is partially absent in a region outside a region where the IDT electrode is located in plan view. The elastic wave device further includes a support layer located on the support substrate in at least a portion of a region where the film stack is partially absent and surrounds a region where the film stack is located in plan view and a cover member located on the support layer. The cover member defines a hollow space facing the IDT electrode together with the piezoelectric thin film and the support layer.

18 Claims, 8 Drawing Sheets

(51) Int. Cl.
*H03H 9/10* (2006.01)
*H03H 9/05* (2006.01)
*H01L 41/047* (2006.01)
*H01L 41/18* (2006.01)
*H03H 9/145* (2006.01)
*H03H 9/64* (2006.01)
*H03H 3/08* (2006.01)
*H03H 9/205* (2006.01)

(52) U.S. Cl.
CPC .... *H03H 9/02086* (2013.01); *H03H 9/02992* (2013.01); *H03H 9/059* (2013.01); *H03H 9/1064* (2013.01); *H03H 9/1071* (2013.01); *H03H 9/14541* (2013.01); *H03H 9/25* (2013.01); *H03H 9/64* (2013.01); *H03H 3/08* (2013.01); *H03H 9/0222* (2013.01); *H03H 9/205* (2013.01)

(58) Field of Classification Search
CPC ...... H03H 9/14541; H03H 9/205; H03H 9/25; H03H 9/54; H03H 9/64; H03H 3/08; H03H 9/02826; H03H 9/02897; H03H 9/1092; H03H 9/0585; H03H 9/059; H03H 9/02992; H01L 41/047; H01L 41/18
USPC .................................................. 333/193, 195
See application file for complete search history.

(56) References Cited

U.S. PATENT DOCUMENTS

| | | | |
|---|---|---|---|
| 7,245,193 B2 * | 7/2007 | Funasaka | H03H 9/02574 333/193 |
| 9,831,850 B2 * | 11/2017 | Kuroyanagi | H03H 9/02992 |
| 10,148,245 B2 * | 12/2018 | Kai | H03H 9/02574 |
| 10,243,536 B2 * | 3/2019 | Saijo | H03H 9/1071 |
| 10,320,362 B2 * | 6/2019 | Kikuchi | H03H 3/08 |
| 2010/0253182 A1 | 10/2010 | Takada et al. | |
| 2010/0289600 A1 | 11/2010 | Takada et al. | |
| 2013/0049889 A1 * | 2/2013 | Shimizu | H03H 3/10 333/195 |
| 2013/0285768 A1 | 10/2013 | Watanabe et al. | |
| 2014/0152146 A1 | 6/2014 | Kimura et al. | |
| 2014/0354114 A1 | 12/2014 | Moriya et al. | |
| 2016/0261249 A1 | 9/2016 | Takamine | |
| 2017/0214386 A1 * | 7/2017 | Kido | H03H 9/25 |
| 2018/0102757 A1 * | 4/2018 | Fukushima | H03H 9/02574 |

FOREIGN PATENT DOCUMENTS

| | | |
|---|---|---|
| JP | 2006-121356 A | 5/2006 |
| JP | 2007-036656 A | 2/2007 |
| JP | 2008-060382 A | 3/2008 |
| JP | 2009-200093 A | 9/2009 |
| JP | 2014-236387 A | 12/2014 |
| JP | 2015-109622 A | 6/2015 |
| KR | 10-2013-0086378 A | 8/2013 |
| WO | 2009/078137 A1 | 6/2009 |
| WO | 2009/104438 A1 | 8/2009 |
| WO | 2012/086441 A1 | 6/2012 |
| WO | 2012/086639 A1 | 6/2012 |
| WO | 2015/080045 A1 | 6/2015 |

OTHER PUBLICATIONS

Official Communication issued in corresponding Korean Patent Application No. 10-2017-7031881, dated Nov. 20, 2018.
Official Communication issued in International Patent Application No. PCT/JP2016/067408, dated Aug. 16, 2016.

* cited by examiner

ELASTIC WAVE DEVICE

CROSS REFERENCE TO RELATED APPLICATIONS

This application claims the benefit of priority to Japanese Patent Application No. 2015-127148 filed on Jun. 25, 2015 and is a Continuation Application of PCT Application No. PCT/JP2016/067408 filed on Jun. 10, 2016. The entire contents of each application are hereby incorporated herein by reference.

BACKGROUND OF THE INVENTION

1. Field of the Invention

The present invention relates to elastic wave devices including a film stack stacked on a support substrate.

2. Description of the Related Art

An elastic wave device disclosed in WO 2012/086639 A1 below includes a film stack located on a support substrate and a piezoelectric thin film stacked on the film stack. The film stack includes a high-acoustic-velocity film and a low-acoustic-velocity film. The low-acoustic-velocity film is a film along which a bulk wave propagates at a lower acoustic velocity than a bulk wave propagates along the piezoelectric thin film. The high-acoustic-velocity film is a film along which a bulk wave propagates at a higher acoustic velocity than an elastic wave propagates along the piezoelectric thin film.

An elastic wave device disclosed in WO 2009/104438 A1 below includes a piezoelectric thin film on which a support layer and a cover member define a hollow space. An IDT electrode is sealed in the hollow space.

The piezoelectric thin films of the elastic wave devices disclosed in WO 2012/086639 A1 and WO 2009/104438 A1 include piezoelectric single crystals, for example, $LiTaO_3$. Such piezoelectric thin films are easily cracked and chipped due to external force. In particular, such piezoelectric thin films may be cracked and chipped when stress is applied, for example, during the step of bonding external connection terminals and dicing.

The elastic wave device disclosed in WO 2012/086639 A1 may also suffer interfacial delamination in the stack including the piezoelectric thin film during the attachment of external connection terminals and dicing.

For an elastic wave device as disclosed in WO 2009/104438 A1, it is necessary to maintain the sealed condition of the hollow structure. The sealed condition of the hollow structure is typically checked by leak detection, and accordingly the elastic wave device is screened out if the elastic wave device is defective. However, if the hollow structure as described above is applied to the stack disclosed in WO 2012/086639 A1, it may be impossible to check the sealed condition of the hollow structure by leak detection. In this case, it is difficult to screen out the elastic wave device by leak detection if the elastic wave device is defective.

SUMMARY OF THE INVENTION

Preferred embodiments of the present invention provide elastic wave devices, including hollow structures, that significantly reduce or prevent cracking and chipping of a piezoelectric thin film, that significantly reduce or prevent interfacial delamination in a film stack, and that are able to be easily screened out by leak detection if the elastic wave device is defective.

An elastic wave device according to a preferred embodiment of the present invention includes a support substrate, a film stack located on the support substrate and including a plurality of films including a piezoelectric thin film, and an IDT electrode located on one surface of the piezoelectric thin film. The film stack is partially absent in a region outside a region where the IDT electrode is located in plan view. The elastic wave device further includes a support layer located on the support substrate in at least a portion of a region where the film stack is partially absent and surrounds a region where the film stack is located in plan view and a cover member located on the support layer and defining a hollow space facing the IDT electrode together with the piezoelectric thin film and the support layer.

In an elastic wave device according to a preferred embodiment of the present invention, the piezoelectric thin film includes $LiTaO_3$. This is effective in further significantly reducing or preventing cracking and chipping of the piezoelectric thin film due to external force.

In an elastic wave device according to a preferred embodiment of the present invention, the elastic wave device further includes a first insulating layer that extends from at least a portion of the region where the film stack is absent onto the piezoelectric thin film and a wiring electrode electrically connected to the IDT electrode. The wiring electrode extends from an upper surface of the piezoelectric thin film onto the first insulating layer to reach a portion of the first insulating layer located in the region where the film stack is absent. This significantly reduces or prevents disconnection of the wiring electrode.

In an elastic wave device according to a preferred embodiment of the present invention, the first insulating layer extends from the upper surface of the piezoelectric thin film across a side surface of the film stack to at least a portion of the region where the film stack is absent. This is effective in further significantly reducing or preventing interfacial delamination in the film stack.

In an elastic wave device according to a preferred embodiment of the present invention, the first insulating layer includes an inclined surface facing away from the support substrate. The inclined surface is inclined to be located closer to the piezoelectric thin film as the inclined surface extends from the region where the film stack is absent toward a portion located on the piezoelectric thin film. This further significantly reduces or prevents disconnection of the wiring electrode on the first insulating layer.

In an elastic wave device according to a preferred embodiment of the present invention, the inclined surface of the first insulating layer extends from an upper surface of the support substrate to the portion of the first insulating layer located on the piezoelectric thin film.

In an elastic wave device according to a preferred embodiment of the present invention, the first insulating layer extends from the inclined surface of the first insulating layer to the region where the film stack is absent.

In an elastic wave device according to a preferred embodiment of the present invention, the film stack includes the piezoelectric thin film and a high-acoustic-velocity film along which a bulk wave propagates at a higher acoustic velocity than an elastic wave propagates along the piezoelectric thin film. The piezoelectric thin film is stacked on the high-acoustic-velocity film.

In an elastic wave device according to a preferred embodiment of the present invention, the plurality of films of the film stack include the piezoelectric thin film, a high-acoustic-velocity film along which a bulk wave propagates at a higher acoustic velocity than an elastic wave propagates along the piezoelectric thin film, and a low-acoustic-velocity film, stacked on the high-acoustic-velocity film, along which a bulk wave propagates at a lower acoustic velocity than an elastic wave propagates along the piezoelectric thin film. The piezoelectric thin film is stacked on the low-acoustic-velocity film. This is effective in confining an elastic wave within the piezoelectric thin film.

In an elastic wave device according to a preferred embodiment of the present invention, the film stack includes the piezoelectric thin film, a high-acoustic-impedance film with a relatively high acoustic impedance, and a low-acoustic-impedance film with a lower acoustic impedance than the high-acoustic-impedance film. This is effective in confining an elastic wave within the piezoelectric thin film.

The preferred embodiments of the present invention provide elastic wave devices, including hollow structures, that significantly reduce or prevent cracking and chipping of a piezoelectric thin film, that significantly reduce or prevent interfacial delamination in a film stack, and that are able to be easily screened out by leak detection if the elastic wave device is defective.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
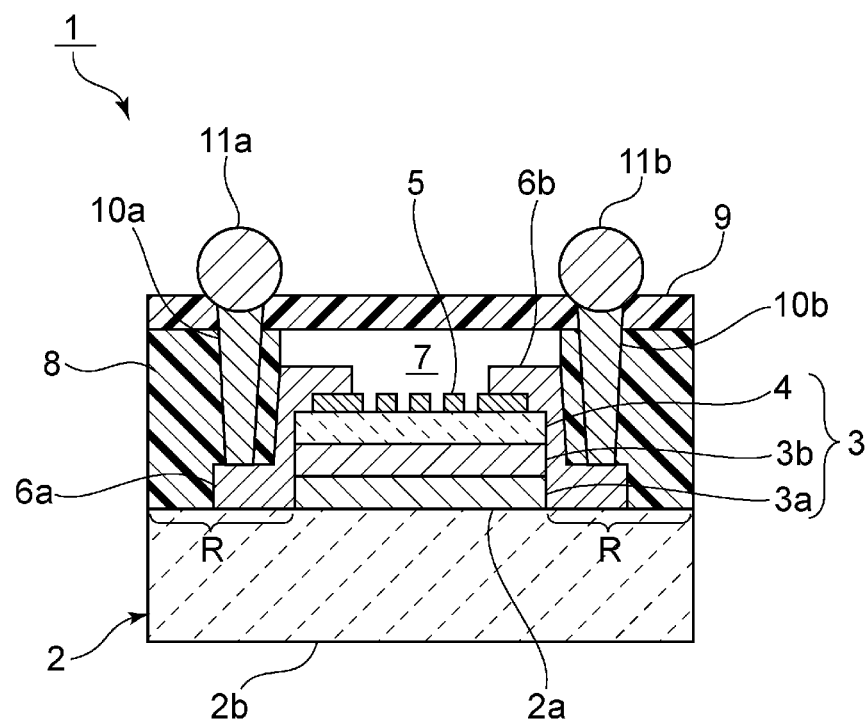
FIG. 1A is a schematic front sectional view of an elastic wave device according to a first preferred embodiment of the present invention.

Preferred embodiments of the present invention will now be described with reference to the drawings in order to clarify the invention.

It is pointed out that the various preferred embodiments disclosed herein are illustrative, and that the present invention is not limited to matters disclosed in the following preferred embodiments. Partial substitutions and combinations of the features and elements are possible between different preferred embodiments, and modified preferred embodiments in those cases are also included in the scope of the present invention. The drawings serve to assist understanding of the preferred embodiments, and they are not always exactly drawn in a strict sense. In some cases, for instance, dimension ratios between constituent elements themselves or dimension ratios of distances between elements or features, which are shown in the drawings, are not in match with the dimension ratios described in the description. Furthermore, some of the elements or features, which are explained in the description, are omitted from the drawings, or they are shown in a reduced number on a case-by-case basis.

First Preferred Embodiment

Figure 1B:
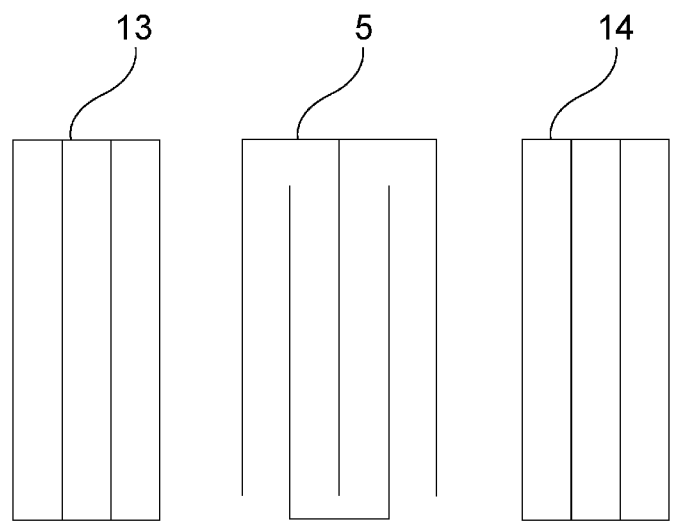
FIG. 1B is a schematic plan view showing the electrode structure thereof.

FIG. 1A is a schematic front sectional view of an elastic wave device according to a first preferred embodiment of the present invention, and FIG. 1B is a schematic plan view showing the electrode structure thereof.

An elastic wave device 1 includes a support substrate 2. The support substrate 2 includes opposing first and second main surfaces 2a and 2b. A film stack 3 is located on the first main surface 2a. The film stack 3 includes a high-acoustic-velocity film 3a, a low-acoustic-velocity film 3b stacked on the high-acoustic-velocity film 3a, and a piezoelectric thin film 4 stacked on the low-acoustic-velocity film 3b. The piezoelectric thin film 4 is located at the uppermost position of the film stack 3. The high-acoustic-velocity film 3a is a film along which a bulk wave propagates at a higher acoustic velocity than an elastic wave propagates along the piezoelectric thin film 4. The low-acoustic-velocity film 3b is a film along which a bulk wave propagates at a lower acoustic velocity than an elastic wave propagates along the piezoelectric thin film 4.

The acoustic velocity of a bulk wave is intrinsic to each material. Bulk waves include P-waves, which vibrate in a travel direction of the waves, i.e., in a longitudinal direction, and S-waves, which vibrate in a direction perpendicular or substantially perpendicular to the travel direction, i.e., in a transverse direction. These bulk waves propagate along any of the piezoelectric thin film 4, the high-acoustic-velocity film 3a, and the low-acoustic-velocity film 3b. P-waves and S-waves are available on isotropic materials, and P-waves, slow S-waves, and fast S-waves are available on anisotropic materials. If a surface acoustic wave is excited on an anisotropic material, two S-waves, i.e., an SH-wave and an SV-wave, occur. As described herein, of these three modes, i.e., the P-wave, the SH-wave, and the SV-wave, the acoustic velocity of the elastic wave that is the main mode of propagation along the piezoelectric thin film 4 refers to the acoustic velocity of the mode that provides a pass band as a filter or resonance characteristics as a resonator.

An adhesion layer may be provided between the high-acoustic-velocity film 3a and the piezoelectric thin film 4. The adhesion layer improves the adhesion between the high-acoustic-velocity film 3a and the piezoelectric thin film 4. The adhesion layer may include a resin or metal, for example, an epoxy resin or polyimide resin.

Suitable piezoelectric thin film materials include, but not limited to, $LiTaO_3$, $LiNbO_3$, ZnO, AlN, and PZT. In this preferred embodiment, the piezoelectric thin film 4 includes $LiTaO_3$. It should be noted that other piezoelectric single crystals may also be included. The piezoelectric thin film 4 preferably has a thickness of, for example, about $1.5\lambda$ or less, where $\lambda$ is the wavelength of an elastic wave, which is determined by the electrode period of the IDT electrode. This is because the selection of the thickness of the piezoelectric thin film 4 within the range of about $1.5\lambda$ or less, for example, facilitates adjustment of the electromechanical coupling factor.

The high-acoustic-velocity film 3a includes a suitable material that satisfies the acoustic velocity relationship described above. Suitable materials include, for example, piezoelectric materials such as aluminum nitride, aluminum oxide, silicon carbide, silicon nitride, silicon oxynitride, DLC films, silicon, sapphire, lithium tantalate, lithium niobate, and quartz; various ceramics such as alumina, zirconia, cordierite, mullite, steatite, and forsterite; and other materials such as magnesia and diamond. Materials based on these materials and materials based on mixtures of these materials may also be included.

The low-acoustic-velocity film 3b includes a suitable material along which a bulk wave propagates at a lower acoustic velocity than an elastic wave propagates along the piezoelectric thin film 4. Suitable materials include, for example, silicon oxide, glass, silicon oxynitride, tantalum oxide, and silicon oxides doped with elements such as fluorine, carbon, and boron. The low-acoustic-velocity film 3b may also include mixed materials based on these materials.

Figure 11:
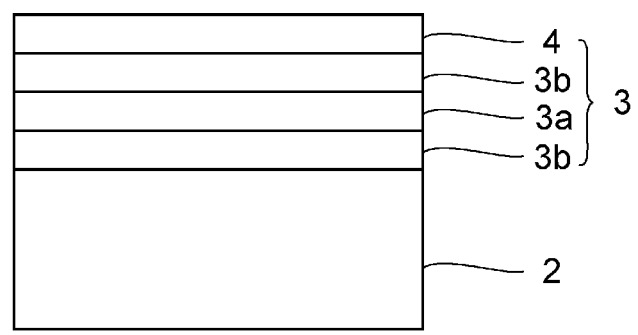
FIG. 11 is a simplified front view illustrating a modification of a film stack.

The stacking of the film stack including the high-acoustic-velocity film 3a and the low-acoustic-velocity film 3b on the piezoelectric thin film 4 increases the Q value, as discussed in WO 2012/086639 A1. The film stack 3 may include a plurality of high-acoustic-velocity films and a plurality of low-acoustic-velocity films. For example, as shown in the simplified front view in FIG. 11, the film stack 3 on the support substrate 2 may include, in order from the support substrate 2 side, a low-acoustic-velocity film 3b, a high-acoustic-velocity film 3a, a low-acoustic-velocity film 3b, and a piezoelectric thin film 4. This is effective in confining the energy of the elastic wave within the portion provided by stacking the piezoelectric thin film 4 and the low-acoustic-velocity films 3b. In addition, higher-order spurious modes are able to be significantly reduced or prevented by allowing the higher-order spurious modes to leak to the support substrate 2 side of the high-acoustic-velocity film 3a. Thus, good characteristics due to the elastic wave (for example, good resonance characteristics or filter characteristics) are able to be provided, and undesirable responses due to higher-order modes are able to be significantly reduced or prevented. The film stack 3 may further include films other than the piezoelectric thin film 4, the high-acoustic-velocity film 3a, and the low-acoustic-velocity films 3b, for example, dielectric films.

An IDT electrode 5 is located on the piezoelectric thin film 4. The IDT electrode 5 is electrically connected to wiring electrodes 6a and 6b.

More specifically, the electrode structure shown in FIG. 1B is provided on the piezoelectric thin film 4. That is, the IDT electrode 5 and reflectors 13 and 14 located on both sides of the IDT electrode 5 in a propagation direction of elastic waves are provided, thus defining a one-port elastic wave resonator. It should be noted that any electrode structure including an IDT electrode may be included in various preferred embodiments of the present invention. A plurality of resonators may be combined to define a filter. Examples of such filters include ladder filters, longitudinally coupled resonator filters, and lattice filters.

The IDT electrode 5 includes first and second bus bars and first and second electrode fingers. The first and second electrode fingers extend in a direction perpendicular or substantially perpendicular to the propagation direction of elastic waves. The first and second electrode fingers are interdigitated with each other. The first electrode fingers are connected to the first bus bar, and the second electrode fingers are connected to the second bus bar.

Examples of materials of the IDT electrode 5 include, but not limited to, suitable metals and alloys, for example, Cu, Ni, Ni—Cr alloys, Al—Cu alloys, Ti, Al, and Pt. These metals and alloys may be included alone or in combination. The IDT electrode 5 may also include a metal film stack of a plurality of metal films.

The IDT electrode 5 may be provided by any process. For example, the IDT electrode 5 is able to be provided on the piezoelectric thin film 4 by evaporation and lift-off.

The elastic wave device 1 includes a hollow space 7 facing the IDT electrode 5. Specifically, a support layer 8 including an opening is located on the support substrate 2. The support layer 8 is frame-shaped. The support layer 8 includes a synthetic resin. The support layer 8 may also include an inorganic insulating material.

The structure defined by stacking the film stack 3 is partially absent on the support substrate 2. Specifically, the first main surface 2a of the support substrate 2 includes a region R where the structure defined by stacking the film stack 3 is absent outside the region where the film stack 3 is located. The film stack 3 may be partially removed by any process. For example, the film stack 3 is able to be removed from the underlying portion where the support layer 8 is to be located by patterning a resist by a photolithography technique and then etching the film stack 3, for example, by an RIE system.

The elastic wave device 1 includes the support layer 8 located in a portion of the region R. Specifically, the support layer 8 surrounds the region where the film stack 3 is located in plan view.

A cover member 9 closes the opening in the support layer 8. The cover member 9 defines the hollow space 7 facing the IDT electrode 5 together with the support layer 8 and the support substrate 2.

The support layer 8 and the cover member 9 also include through-holes that extend therethrough. Under-bump metal layers 10a and 10b are located in the through-holes. Metal bumps 11a and 11b are bonded to the under-bump metal layers 10a and 10b, respectively.

The under-bump metal layers 10a and 10b and the metal bumps 11a and 11b include a suitable metal or alloy.

The lower end of the under-bump metal layer 10a is bonded to the wiring electrode 6a. The lower end of the under-bump metal layer 10b is bonded to the wiring electrode 6b. Thus, the portions of the wiring electrodes 6a and 6b bonded to the under-bump metal layers 10a and 10b define and function as electrode lands for electrical connection to external connection terminals. In this preferred embodiment, the metal bumps 11a and 11b are provided as external connection terminals.

The elastic wave device 1 includes the electrode lands, described above, located in the region R. Thus, no stress is directly applied to the portion defined by stacking the film stack 3 during the bonding of the metal bumps 11a and 11b, defining and functioning as external connection terminals. Thus, the elastic wave device 1 significantly reduces or prevents cracking and chipping of the piezoelectric thin film 4. The elastic wave device 1 also significantly reduces or prevents interfacial delamination in the film stack 3. The elastic wave device 1 significantly reduces or prevents cracking and chipping of the piezoelectric thin film 4 and interfacial delamination not only when stress is applied during the formation of the metal bumps 11a and 11b, but also when stress is applied during singulation by dicing.

In addition, the elastic wave device 1 includes the support layer 8 located in the region R where the film stack 3 is partially absent. Thus, the elastic wave device 1 is able to be easily screened out by leak detection if the elastic wave device 1 is defective. This will now be described in detail in comparison to a known structure.

Figure 2A:
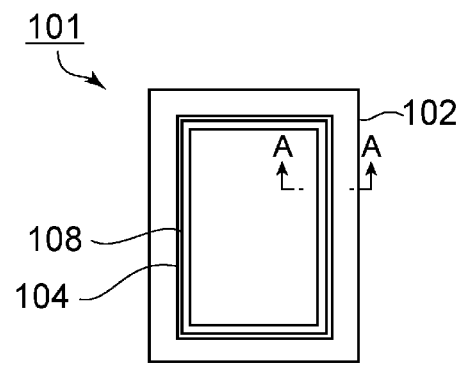
FIG. 2A is a schematic plan view illustrating the position of a support layer in a known elastic wave device.
Figure 2B:
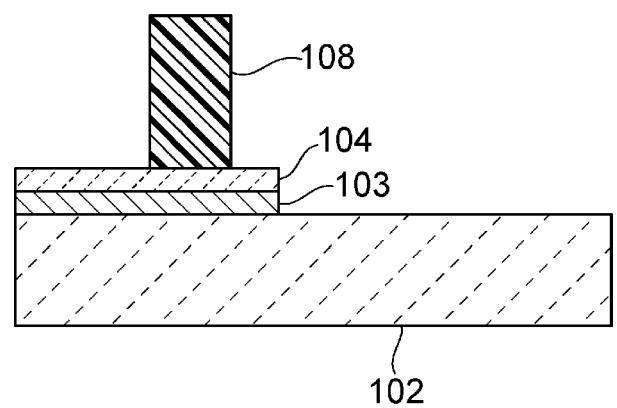
FIG. 2B is a partially cutaway schematic sectional view taken along line A-A in FIG. 2A.
Figure 2C:
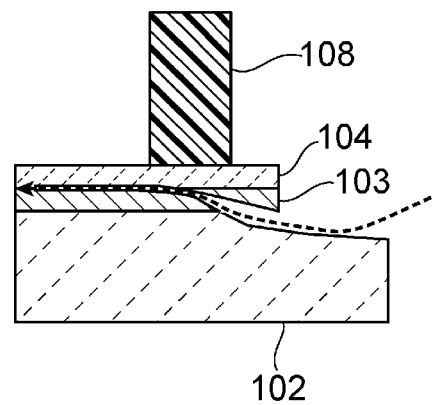
FIG. 2C is a partially cutaway schematic sectional view illustrating a method for leak detection for the known elastic wave device.

FIG. 2A is a schematic plan view illustrating the position of a support layer in a known elastic wave device. FIG. 2B is a partially cutaway schematic sectional view taken along line A-A in FIG. 2A. FIG. 2C is a partially cutaway schematic sectional view illustrating a method for leak detection for the known elastic wave device. In FIGS. 2A to 2C, the wiring electrodes and the specific structure of the film stack are not shown.

As shown in FIGS. 2A and 2B, a known elastic wave device 101 includes a support layer 108 located on a piezoelectric thin film 104. However, if cracking or interfacial delamination occurs in the portion of the elastic wave device 101 below the piezoelectric thin film 104, as shown in FIG. 2C, leak detection may be impossible because the cracking or delamination does not reach the hollow space. In this case, the sealed condition of the hollow structure is not able be checked by leak detection, and it is difficult to screen out the elastic wave device 101 by leak detection if the elastic wave device 101 is defective.

Figure 3A:
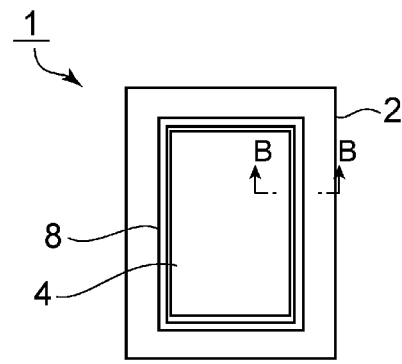
FIG. 3A is a schematic plan view illustrating the position of a support layer in the elastic wave device according to the first preferred embodiment of the present invention.
Figure 3B:
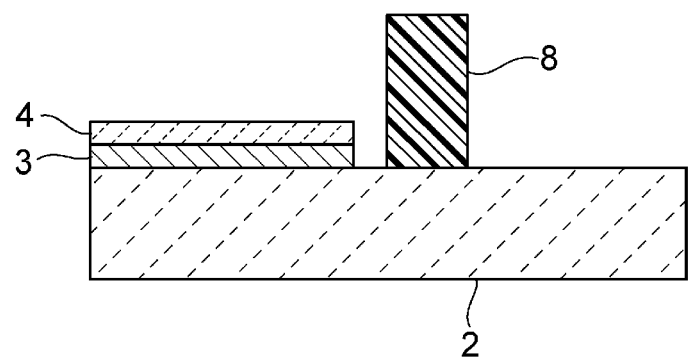
FIG. 3B is a partially cutaway schematic sectional view taken along line B-B in FIG. 3A.
Figure 3C:
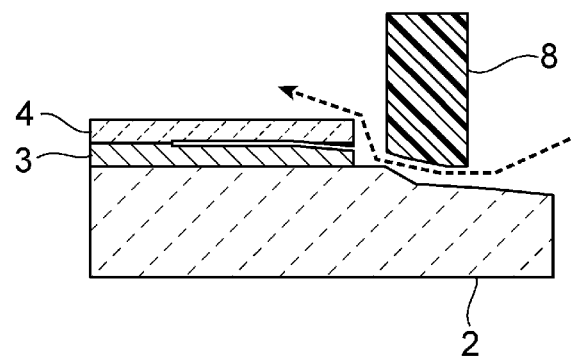
FIG. 3C is a partially cutaway schematic sectional view illustrating a method for leak detection for the elastic wave device according to the first preferred embodiment of the present invention.

FIG. 3A is a schematic plan view illustrating the position of the support layer in the elastic wave device according to the first preferred embodiment. FIG. 3B is a partially cutaway schematic sectional view taken along line B-B in FIG. 3A. FIG. 3C is a partially cutaway schematic sectional view illustrating a method for leak detection for the elastic wave device according to the first preferred embodiment. In FIGS. 3A to 3C, the wiring electrodes 6a and 6b and the specific structure of the film stack 3 are not shown.

As shown in FIGS. 3A and 3B, the elastic wave device 1 includes the support layer 8 located in the region R, described above, where the film stack 3 is partially absent. That is, the support layer 8 is not located on the piezoelectric thin film 4. As shown in FIG. 3C, therefore, cracking or delamination reaches the hollow space 7 in the elastic wave device 1, and the cracking or delamination is able to provide leak detection. Thus, even if cracking or interfacial delamination occurs in the portion of the elastic wave device 1 below the piezoelectric thin film 4, the sealed condition of the hollow structure is able to be checked by leak detection, and accordingly the elastic wave device 1 is able to be easily screened out if the elastic wave device 1 is defective.

Second Preferred Embodiment

Figure 4:
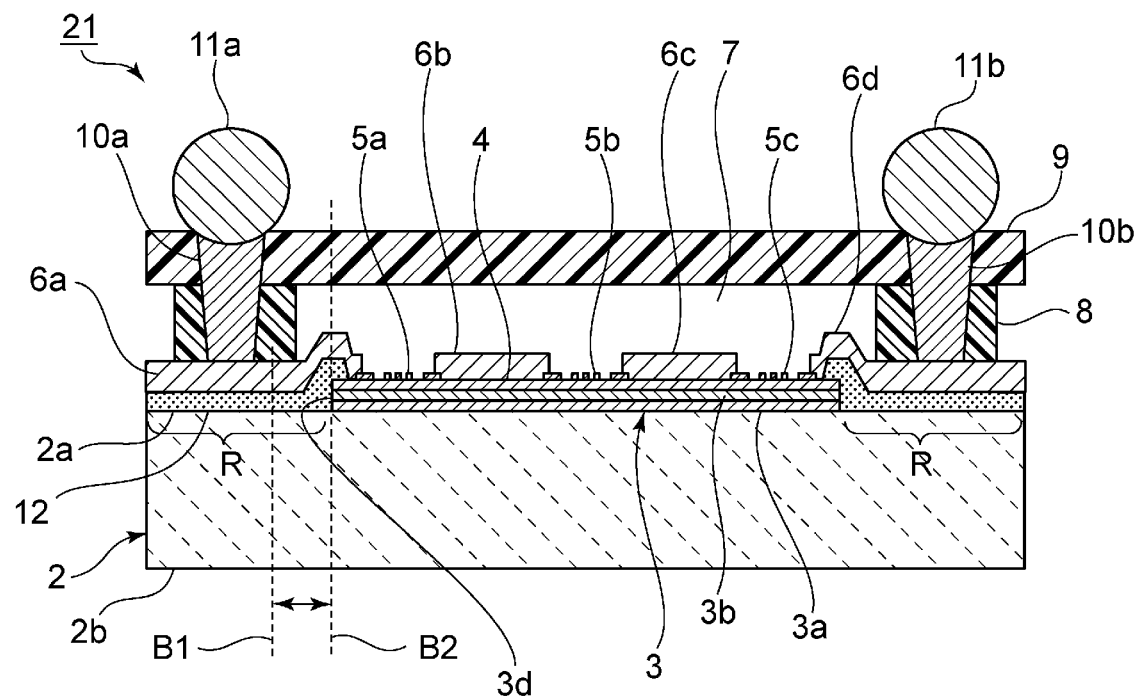
FIG. 4 is a schematic front sectional view of an elastic wave device according to a second preferred embodiment of the present invention.

FIG. 4 is a schematic front sectional view of an elastic wave device according to a second preferred embodiment of the present invention. As shown in FIG. 4, an elastic wave device 21 includes IDT electrodes 5a to 5c located on a piezoelectric thin film 4. The IDT electrodes 5a to 5c are electrically connected to each other with wiring electrodes 6a to 6d.

In the elastic wave device 21, the lower end of an under-bump metal layer 10a is bonded to the wiring electrode 6a, and the lower end of an under-bump metal layer 10b is bonded to the wiring electrode 6d. Thus, the portions of the wiring electrodes 6a and 6d bonded to the under-bump metal layers 10a and 10b define and function as electrode lands for connection to external connection terminals.

In this preferred embodiment, the IDT electrodes 5a to 5c define a plurality of surface acoustic wave resonators that are electrically connected to each other, thus providing a band-pass filter. It should be noted that any filter circuit may be provided.

A first insulating layer 12 is located on the support substrate 2. The first insulating layer 12 includes a synthetic resin. Examples of synthetic resins include polyimide and epoxy. The first insulating layer 12 may include any material, including inorganic insulating materials. Examples of materials of the first insulating layer 12 include suitable materials, for example, SOG, $SiO_2$, TEOS, and SiN. The first insulating layer 12 extends from the region R of the first main surface 2a of the support substrate 2 across a side surface 3d of the film stack 3 to the upper surface of the piezoelectric thin film 4.

The elastic wave device 21 includes the electrode lands, described above, located in the region R. Thus, no stress is directly applied to the portion defined by stacking the film stack 3 during the bonding of the metal bumps 11a and 11b, defining and functioning as external connection terminals. Thus, the elastic wave device 21 significantly reduces or prevents cracking and chipping of the piezoelectric thin film 4. The elastic wave device 1 also significantly reduces or prevents interfacial delamination in the film stack 3. The elastic wave device 21 significantly reduces or prevents cracking and chipping of the piezoelectric thin film 4 and interfacial delamination not only when stress is applied during the formation of the metal bumps 11a and 11b, but also when stress is applied during singulation by dicing.

Figure 5:
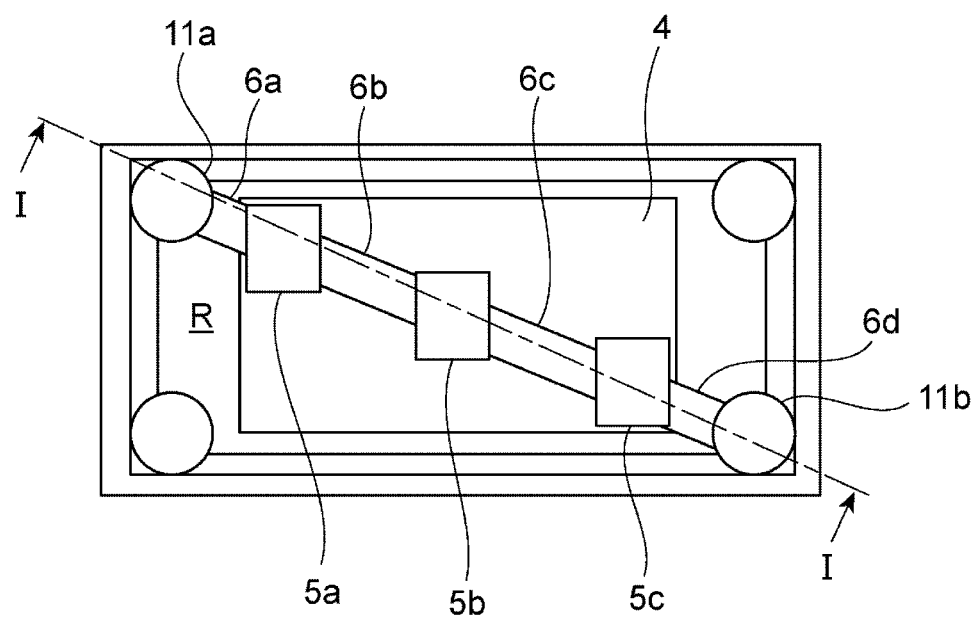
FIG. 5 is a simplified plan view of the elastic wave device according to the second preferred embodiment of the present invention.
Figure 6:
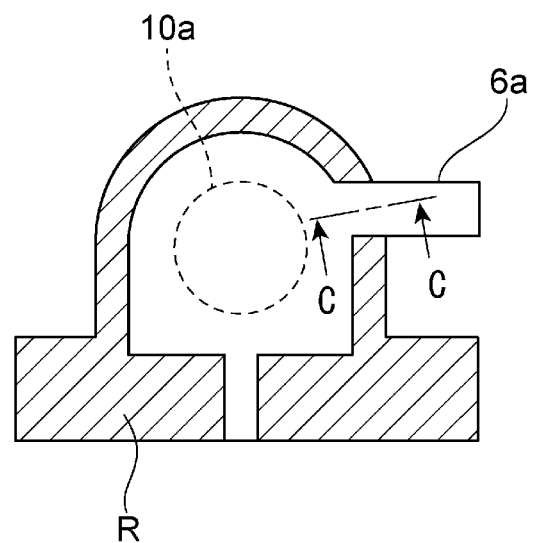
FIG. 6 is a simplified plan view illustrating a relevant portion of the elastic wave device according to the second preferred embodiment of the present invention.

FIG. 5 is a simplified plan view of the elastic wave device 21. FIG. 5 shows the electrode structure below the cover member 9 described above as viewed through the cover member 9, with the metal bumps 11a and 11b remaining. The regions where the IDT electrodes 5a to 5c are located are shown as rectangles. FIG. 4 is a sectional view of the portion extending along line I-I in FIG. 5. FIG. 6 shows, in an enlarged view, the specific structure of the wiring electrode 6a on which the under-bump metal layer 10a is located. In FIG. 6, the wiring electrode 6a is located within the region R. The dashed line in FIG. 6 indicates the portion to which the under-bump metal layer 10a is bonded. The portion extending along line C-C in FIG. 6 corresponds to the portion extending between dashed lines B1 and B2 in FIG. 4.

Figure 7A:
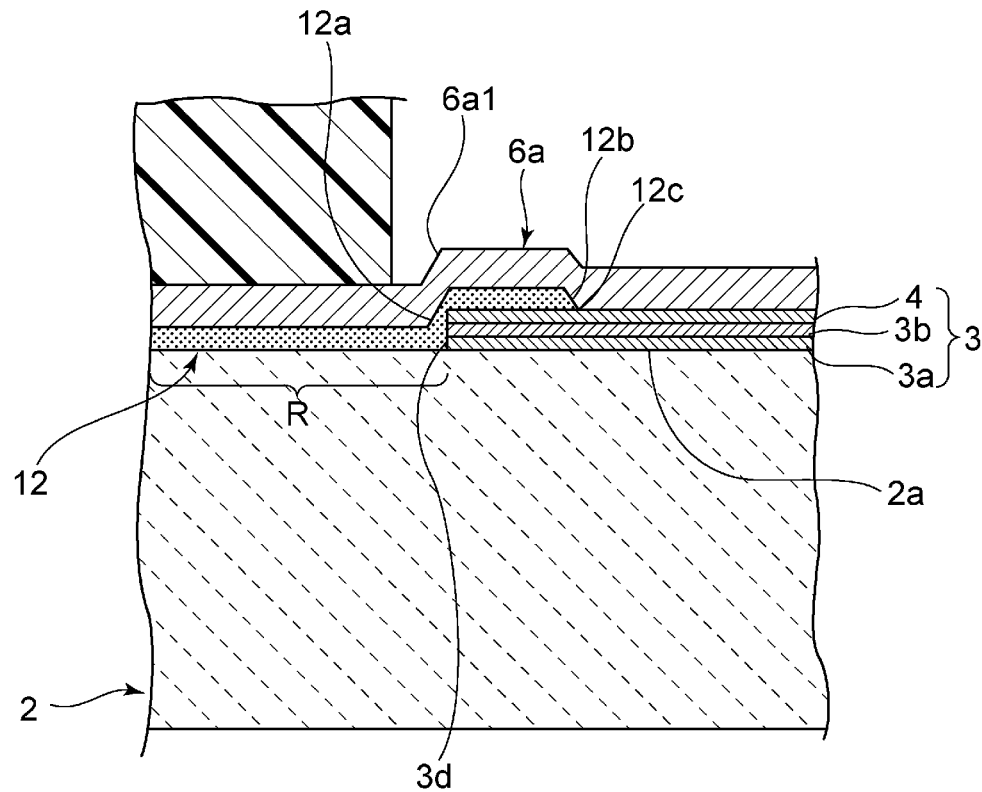
FIG. 7A is a partially cutaway enlarged sectional view showing a portion extending along line C-C in FIG. 6.

FIG. 7A is a partially cutaway schematic sectional view showing, in an enlarged view, the portion extending along line C-C, i.e., the portion indicated by dashed lines B1 and B2.

Figure 7B:
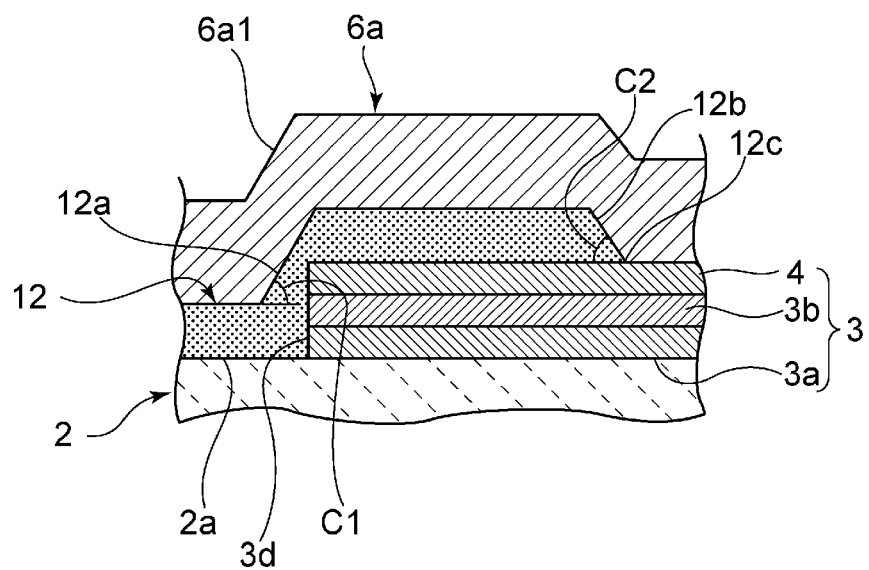
FIG. 7B is a partially cutaway schematic sectional view showing the relevant portion in FIG. 7A in an enlarged view.

As shown in FIG. 7A, the first insulating layer 12 extends from its portion located in the region R onto the piezoelectric thin film 4. In this case, as shown in an enlarged view in FIG. 7B, the first insulating layer 12 includes an inclined surface 12a facing away from the support substrate 2 above the side surface 3d of the film stack 3. The inclined surface 12a is located farther away from the first main surface 2a of the support substrate 2 as the inclined surface 12a extends from above the region R to above the piezoelectric thin film 4. Accordingly, the angle between the first main surface 2a and an inclined surface 6a1 of the wiring electrode 6a becomes smaller. This significantly reduces or prevents the degree of bend in the portion of the wiring electrode 6a where the inclined surface 6a1 is provided. In other words, the first insulating layer 12 is able to mitigate the influence of the step between the portion of the first main surface 2a of the support substrate 2 in the region R outside the side surface 3d and the upper surface of the piezoelectric thin film 4. This significantly reduces or prevents disconnection of the wiring electrode 6a.

It is desirable that the angle C1 between the inclined surface 12a and the first main surface 2a of the support substrate 2 be 80° or less.

Preferably, it is desirable that an inclined surface 12b be provided at an inner edge 12c of the first insulating layer 12. It is desirable that the angle C2 between the inclined surface 12b and the first main surface 2a be about 80° or less, for example. This significantly reduces or prevents disconnection of the wiring electrode 6a above the inclined surface 12b.

More preferably, the angle C1 between the inclined surface 12a and the first main surface 2a and the angle C2 between the inclined surface 12b and the first main surface 2a are about 60° or less, for example. Even more preferably, the angle C1 between the inclined surface 12a and the first main surface 2a and the angle C2 between the inclined surface 12b and the first main surface 2a are about 45° or less, for example.

As described above, the degree of bend of the wiring electrode 6a is significantly reduced or prevented. This reduces the likelihood of disconnection upon application of heat and during the step of defining the wiring electrode 6a.

In addition, the first insulating layer 12 covers the side surface 3d of the film stack 3. This significantly reduces or prevents interfacial delamination in the film stack 3. Other features of the second preferred embodiment are similar to those of the first preferred embodiment.

The elastic wave device 21 includes the support layer 8 located in the region R where the film stack 3 is partially absent. Thus, the elastic wave device 21 is able to be easily screened out by leak detection if the elastic wave device 21 is defective.

Third Preferred Embodiment

Figure 8A:
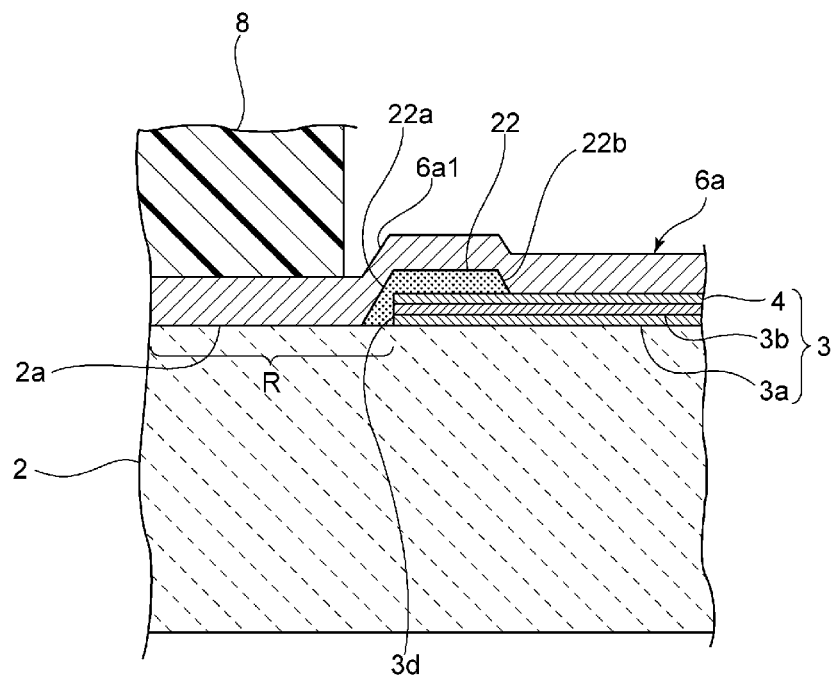
FIG. 8A is a partially cutaway schematic sectional view showing, in an enlarged view, a relevant portion of an elastic wave device according to a third preferred embodiment of the present invention.
Figure 8B:
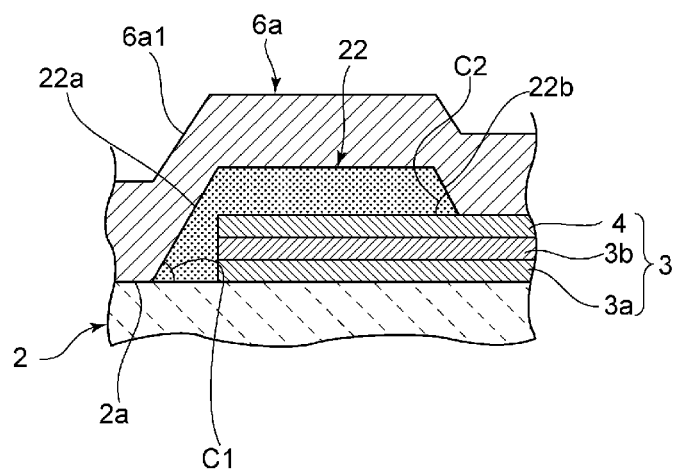
FIG. 8B is a partially cutaway schematic sectional view showing the relevant portion in a further enlarged view.

FIG. 8A is a partially cutaway schematic sectional view showing, in an enlarged view, a relevant portion of an elastic wave device according to a third preferred embodiment of the present invention, and FIG. 8B is a partially cutaway schematic sectional view showing the relevant portion in a further enlarged view. FIGS. 8A and 8B are sectional views of the portion corresponding to the portion shown in FIGS. 7A and 7B for the second preferred embodiment.

As shown in FIG. 8A, a first insulating layer 22 in the third preferred embodiment extends from the region R, described above, of the first main surface 2a of the support substrate 2 onto the piezoelectric thin film 4. The first insulating layer 12 of the elastic wave device according to the second preferred embodiment extends outward in the region R, and the first insulating layer 22 in the third preferred embodiment includes an inclined surface 22a with one end thereof in contact with the first main surface 2a of the support substrate 2. That is, the first insulating layer 12 does not extend outside the inclined surface 22a. As in the second preferred embodiment, an inclined surface 22b extending to the upper surface of the piezoelectric thin film 4 is also provided on the piezoelectric thin film 4.

As shown in FIG. 8B, it is desirable that the angle C1 between the inclined surface 22a and the first main surface 2a and the angle C2 between the inclined surface 22b and the first main surface 2a be about 80° or less, for example, as in the second preferred embodiment.

More preferably, the angle C1 between the inclined surface 22a and the first main surface 2a and the angle C2 between the inclined surface 22b and the first main surface 2a are about 60° or less, for example. Even more preferably, the angle C1 between the inclined surface 22a and the first main surface 2a and the angle C2 between the inclined surface 22b and the first main surface 2a are about 45° or less, for example.

Thus, the first insulating layer 22 may extend from its portion located above the piezoelectric thin film 4 and may end at the inclined surface 22a extending toward the region R. In this case, as in the first preferred embodiment, an under-bump metal layer and a metal bump are bonded to the wiring electrode 6a in the region R, which significantly reduces or prevents cracking and chipping of the piezoelectric thin film 4. In addition, the wiring electrode 6a includes the inclined surface 6a1, which significantly reduces or prevents disconnection of the wiring electrode 6a.

In the third preferred embodiment, the support layer 8 is located in the region R where the film stack 3 is partially absent. Thus, the elastic wave device is able to be easily screened out by leak detection if the elastic wave device is defective.

Fourth Preferred Embodiment

Figure 9:
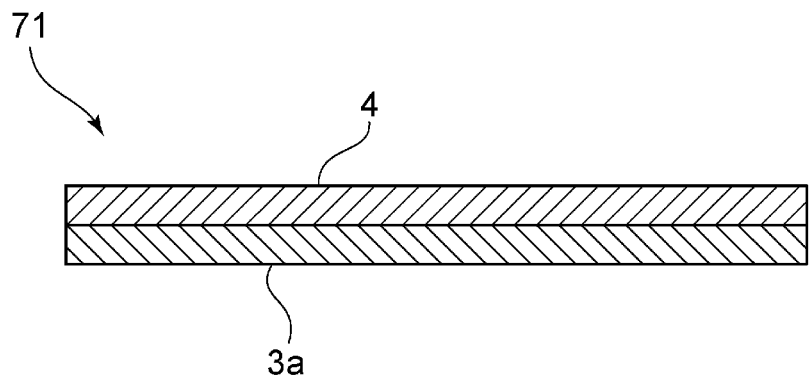
FIG. 9 is a schematic front sectional view of a film stack of an elastic wave device according to a fourth preferred embodiment of the present invention.

FIG. 9 is a front sectional view of a film stack of an elastic wave device according to a fourth preferred embodiment of the present invention. In the fourth preferred embodiment, a film stack 71 includes a high-acoustic-velocity film 3a and a piezoelectric thin film 4. As in the film stack 71, a low-acoustic-velocity film need not be provided. The elastic wave device according to the fourth preferred embodiment is identical to the elastic wave device 1 according to the first preferred embodiment except that the film stack 3 is replaced with the film stack 71. Thus, the fourth preferred embodiment provides the same or similar features and effects as the first preferred embodiment.

Fifth Preferred Embodiment

Figure 10:
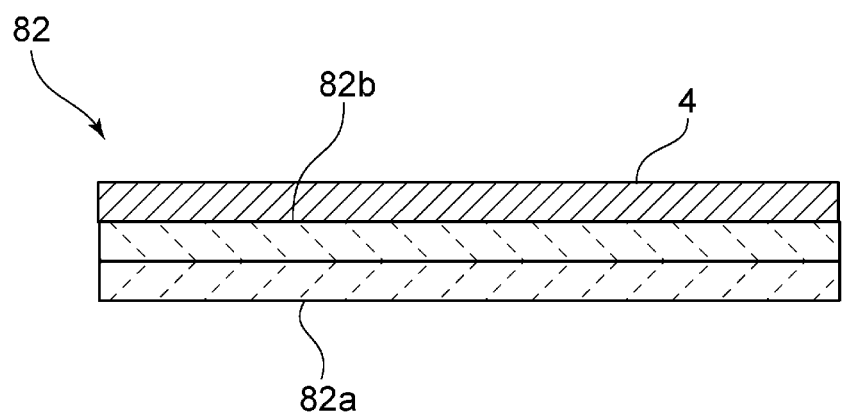
FIG. 10 is a schematic front sectional view of a film stack of an elastic wave device according to a fifth preferred embodiment of the present invention.

FIG. 10 is a schematic front sectional view of a film stack of an elastic wave device according to a fifth preferred embodiment of the present invention. In the fifth preferred embodiment, a film stack 82 includes a high-acoustic-impedance film 82a with a relatively high acoustic impedance and a low-acoustic-impedance film 82b with a relatively low acoustic impedance on the high-acoustic-impedance film 82a. The piezoelectric thin film 4 is stacked on the low-acoustic-impedance film 82b. The film stack 3 may be replaced with the film stack 82. Thus, in the preferred embodiments of the present invention, a film stack including a high-acoustic-velocity film and a low-acoustic-velocity film as described above need not be included; instead, a film stack including a structure defined by stacking a high-acoustic-impedance film and a low-acoustic-impedance film may be included.

In the preferred embodiments of the present invention, a film stack including any structure including a piezoelectric thin film may be provided.

Thus, a film stack may be defined by stacking a plurality of dielectric films to improve temperature characteristics.

Elastic wave devices according to the preferred embodiments of the present invention include the support layer located in the region where the piezoelectric thin film and the film stack are partially absent. Thus, these elastic wave devices are able to be easily screened out by leak detection if the elastic wave devices are defective.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a support substrate;
a film stack located on the support substrate, the film stack including a plurality of films including a piezoelectric thin film; and
an IDT electrode located on one surface of the piezoelectric thin film; wherein
the film stack is absent in a region outside a region where the IDT electrode is located in plan view; and
the elastic wave device further includes:
a support layer located on the support substrate in at least a portion of a region where the film stack is absent and surrounds a region where the film stack is located in plan view;
a cover member located on the support layer, the cover member defining a hollow space facing the IDT electrode together with the piezoelectric thin film and the support layer;
a first insulating layer that extends from at least a portion of the region where the film stack is absent onto the piezoelectric thin film; and
a wiring electrode electrically connected to the IDT electrode, the wiring electrode extending from an upper surface of the piezoelectric thin film onto the first insulating layer to reach a portion of the first insulating layer located in the region where the film stack is absent.

2. The elastic wave device according to claim 1, wherein the piezoelectric thin film includes LiTaO$_3$.

3. The elastic wave device according to claim 1, wherein the first insulating layer extends from the upper surface of the piezoelectric thin film across a side surface of the film stack to at least a portion of the region where the film stack is absent.

4. The elastic wave device according to claim 1, wherein the first insulating layer includes an inclined surface facing away from the support substrate, the inclined surface being inclined to be located closer to the piezoelectric thin film as the inclined surface extends from the region where the film stack is absent toward a portion located on the piezoelectric thin film.

5. The elastic wave device according to claim 4, wherein the inclined surface of the first insulating layer extends from an upper surface of the support substrate to the portion of the first insulating layer located on the piezoelectric thin film.

6. The elastic wave device according to claim 4, wherein the first insulating layer extends from the inclined surface of the first insulating layer to the region where the film stack is absent.

7. The elastic wave device according to claim 1, wherein the film stack includes the piezoelectric thin film and a high-acoustic-velocity film along which a bulk wave propagates at a higher acoustic velocity than an elastic wave propagates along the piezoelectric thin film, the piezoelectric thin film being stacked on the high-acoustic-velocity film.

8. The elastic wave device according to claim 7, further comprising an adhesion layer provided between the high-acoustic-velocity film and the piezoelectric thin film.

9. The elastic wave device according to claim 1, wherein the plurality of films of the film stack includes the piezoelectric thin film, a high-acoustic-velocity film along which a bulk wave propagates at a higher acoustic velocity than an elastic wave propagates along the piezoelectric thin film, and a low-acoustic-velocity film, stacked on the high-acoustic-velocity film, along which a bulk wave propagates at a lower acoustic velocity than an elastic wave propagates along the piezoelectric thin film, the piezoelectric thin film being stacked on the low-acoustic-velocity film.

10. The elastic wave device according to claim 1, wherein
the film stack includes the piezoelectric thin film, a high-acoustic-impedance film, and a low-acoustic-impedance film; and
an acoustic impedance of the low-acoustic-impedance film is lower than an acoustic impedance of the high-acoustic-impedance film.

11. The elastic wave device according to claim 1, wherein a thickness of the piezoelectric thin film is less than about one and a half times a wavelength of an elastic wave that propagates along the piezoelectric thin film.

12. The elastic wave device according to claim 1, wherein the film stack includes the piezoelectric thin film, a first low-acoustic-impedance film, a high-acoustic-impedance film, and a second low-acoustic-impedance film.

13. The elastic wave device according to claim 1, wherein
at least one reflector is provided on the one surface of the piezoelectric thin film; and
the at least one reflector is located at a side of the IDT electrode in a propagation direction of an elastic wave that propagates along the piezoelectric thin film.

14. The elastic wave device according to claim 1, wherein the elastic wave device defines a one-port elastic wave resonator.

15. The elastic wave device according to claim 1, wherein the IDT electrode includes first and second electrode fingers that extend in a direction perpendicular or substantially perpendicular to a propagation direction of an elastic wave that propagates along the piezoelectric thin film.

16. The elastic wave device according to claim 15, wherein
the first and second electrode fingers are interdigitated with each other;
the first electrode fingers are connected to a first bus bar; and
the second electrode fingers are connected to a second bus bar.

17. The elastic wave device according to claim 1 wherein
the support layer and cover member each include through-holes; and
at least one of the through-holes includes an under-bump metal layer.

18. The elastic wave device according to claim 17, wherein one end of the wiring electrode is bonded to the under-bump metal layer.

* * * * *